(12) United States Patent
Sakuno

(10) Patent No.: US 6,873,207 B2
(45) Date of Patent: Mar. 29, 2005

(54) POWER AMPLIFICATION CIRCUIT AND COMMUNICATION DEVICE USING THE SAME

(75) Inventor: Keiichi Sakuno, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/993,698

(22) Filed: Nov. 27, 2001

(65) Prior Publication Data

US 2002/0093377 A1 Jul. 18, 2002

(30) Foreign Application Priority Data

Nov. 27, 2000 (JP) ........................................ 2000-359218
Oct. 12, 2001 (JP) ........................................ 2001-315263

(51) Int. Cl.[7] ................................................ H03F 1/36
(52) U.S. Cl. .......................... 330/110; 330/86; 330/293
(58) Field of Search ......................... 330/86, 110, 282, 330/293

(56) References Cited

U.S. PATENT DOCUMENTS

| | | | | |
|---|---|---|---|---|
| 3,098,199 A | * | 7/1963 | Edward et al. | 330/282 |
| 3,895,305 A | * | 7/1975 | Longman, Jr. | 330/149 |
| 4,009,447 A | * | 2/1977 | Wolf et al. | 330/110 |
| 4,764,732 A | * | 8/1988 | Dion | 330/59 |
| 5,023,951 A | * | 6/1991 | Kahn | 398/202 |
| 5,546,050 A | * | 8/1996 | Florian et al. | 330/282 |
| 5,646,573 A | * | 7/1997 | Bayruns et al. | 330/110 |
| 5,661,437 A | * | 8/1997 | Nishikawa et al. | 330/282 |
| 5,805,023 A | * | 9/1998 | Fukuden | 330/302 |
| 5,914,640 A | * | 6/1999 | Nasserbakht | 330/294 |
| 6,057,736 A | * | 5/2000 | Kim et al. | 330/282 |
| 6,246,284 B1 | * | 6/2001 | Nemoto | 330/110 |
| 6,452,452 B1 | * | 9/2002 | Furino, Jr. | 330/278 |

FOREIGN PATENT DOCUMENTS

| | | |
|---|---|---|
| JP | 8111614 | 4/1996 |
| JP | 2000304631 A | * 11/2000 |

* cited by examiner

Primary Examiner—Khanh V. Nguyen
(74) Attorney, Agent, or Firm—Birch, Stewart, Kolasch, & Birch, LLP.

(57) ABSTRACT

A power amplification circuit, and a communication device using the same, which are capable of suppressing gain decreases of a power amplifier due to increases in input signal power in a state near the saturation operation, capable of reducing its size, and low in distortion and high in efficiency. The power amplification circuit includes a power amplifier and a negative feedback circuit connected between a signal input terminal and a signal output terminal of the power amplifier. Impedance of the negative feedback circuit depends on a signal voltage occurring across the negative feedback circuit. By adjusting the characteristic that the negative feedback quantity of the negative feedback circuit to the power amplifier is variable depending on input signal power, gain fluctuations of the power amplifier due to increases or decreases of input signal power or output signal power around a specified output signal power are suppressed.

10 Claims, 16 Drawing Sheets

POWER AMPLIFICATION CIRCUIT AND COMMUNICATION DEVICE USING THE SAME

BACKGROUND OF THE INVENTION

The present invention relates to a power amplification circuit to be used for communication devices (cellular phones as an example) or the like. In particular, the invention relates to a power amplification circuit, as well as a communication device using the same, to be used for transmissions that require low-distortion amplification.

In today's and future radio communications systems such as cellular phones and wireless LAN (Local Area Network) systems, digital modulation-demodulation such as QPSK (Quadrature Phase Shift Keying) and OFDM (Orthogonal Frequency Division Multiplex) have become the mainstream, where the power amplification circuit used in these radio communications systems is required to exhibit low-distortion operations. Furthermore, for lower power consumption of battery-driving terminals, the power amplification circuit is required to exhibit high-efficiency operations. As amplification devices to be used for such power amplification circuits, there have been used bipolar transistors and field effect transistors made by using semiconductors such as silicon and gallium arsenide. These bipolar transistors and field effect transistors have a characteristic that the efficiency increases with increasing nearness to the saturation operation. However, amplitude distortion and phase distortion increase in the saturation-operation region, high-efficiency operation and low-distortion operation are in a trade-off relation. To overcome this trade-off, there has been known a technique that negative feedback is applied to a power amplifier.

FIG. 11 shows a common negative feedback power amplifier circuit. In FIG. 11, reference numeral 102 denotes a power amplifier having a gain G2(Pin) dependent on an input signal power Pin and numeral 103 denotes a negative feedback circuit having a feedback quantity β that depends on an impedance thereof, where a negative feedback power amplification circuit 101 is made up by applying a parallel negative feedback to between input and output of the power amplifier 102 with a negative feedback circuit 103.

In this power amplifier 102, as the input signal power Pin increases so that an output signal power Pout approaches saturation, increment of the output signal power Pout becomes smaller than an increment of input signal power Pin, causing the gain G2(Pin) of the amplifier gradually decreases. This gain decrease is a so-called amplitude distortion, which would cause occurrence of a harmonic distortion. Moreover, in the case of amplitude of a modulated-wave input signal having momentary amplitude fluctuations of carriers, the gain would differ among individual momentary carrier amplitudes, causing amplified output signals to have waveform distortions. Resultantly, communication failures such as increases in adjacent-channel power leakage would be incurred.

Meanwhile, a gain G3(Pin) of the negative feedback power amplification circuit 101 resulting from applying a negative feedback to the power amplifier 102 at the feedback quantity β by the negative feedback circuit 103 results in:

$$G3(Pin) = \frac{G2(Pin)}{1 + G2(Pin)\beta} \qquad \text{(Eq. 1)}$$

As apparent from Equation 1 above, the negative feedback loop gain G2(Pin)β causes the gain to decrease by a degree corresponding to the factor of 1/(1+G2(Pin)β), as compared with a G2(Pin) that results when no negative feedback is applied. Around the saturation output, an increase in the input signal power Pin causes a decrease in G2(Pin) as well as a decrease in the loop gain. Accordingly, since the above factor increases with increasing input signal power Pin, the decrease in the gain G3(Pin) due to the increase in the input signal power Pin around the saturation output with the negative feedback applied results in a milder one than the G2(Pin) resulting when no negative feedback is applied, as shown in FIG. 12. Therefore, around the saturation output, on condition that the output signal power Pout is of the same, the distortion becomes smaller than when no negative feedback is applied, and on condition that the distortion is of the same level, an operation that is more closer to the saturation can be performed, thus allowing an improvement in efficiency to be obtained.

Further, as can be understood from differentiation of Equation 1 by Pin, it holds that $$\frac{dG3(Pin)}{dPin} = \frac{\frac{dG2(Pin)}{dPin}}{(1+G2(Pin)\beta)^2} \qquad \text{(Eq. 2)}$$

Thus, by applying a feedback to the power amplifier 102 according to the factor of $1/(1+G2(Pin)\beta)^2 < 1$, any decrease in the gain of the power amplification circuit in the saturation region can be suppressed. Also, because dG2(Pin)/dPin<0, it follows that dG3(Pin)/dPin<0, so that although the gain decrease is milder than that resulting when no negative feedback is applied, the tendency of gain decreases due to increases in the input signal power Pin is similar to that resulting when no feedback is applied.

Japanese Patent Laid-Open Publication HEI 8-111614 discloses a negative feedback variable-gain power amplification circuit formed from a negative feedback circuit which is provided with a control terminal for a negative feedback quantity so that its gain is controlled by controlling the negative feedback quantity with a control voltage responsive to an input signal power, as shown in FIG. 13. In FIG. 13, reference numeral 171 denotes an amplification-use source-grounded FET (Field Effect Transistor) and 173 denotes a feedback FET, where the source of the feedback FET 173 is connected to the gate of the amplification-use source-grounded FET 171, the gate of the feedback FET 173 is connected to a control terminal 179 via a resistor 177 and the drain of the feedback FET 173 is connected to a control terminal 181. Further, the drain of the amplification-use source-grounded FET 171 is connected to the gate of the feedback FET 173 via a capacitor 175, so that a parallel negative feedback circuit is formed by the feedback FET 173 and the capacitor 175. Also, the control terminals 179, 181 are grounded via bypass capacitors 183, 185, respectively. Further, the gate of the amplification-use source-grounded FET 171 is connected to a signal input terminal 191 via an input matching circuit 187, and the drain of the amplification-use source-grounded FET 171 is connected to a signal output terminal 195 via an output matching circuit 193.

By changing the transconductance of the feedback FET 173 by means of a control voltage V1 applied to the control terminal 179 or a control voltage V2 applied to the control terminal 181, the feedback quantity is changed, by which the gain is controlled. Then, for a large input signal power, the transconductance of the feedback FET 173 is increased by means of the control voltage V1 or V2 to thereby control the gain (more concretely, to decrease the gain) so that the feedback quantity is increased, thus allowing the distortion of the power amplification circuit to be decreased.

However, in the negative feedback power amplification circuit shown in FIG. 11, an attempt to suppress gain decreases to near a saturation operation would require setting the feedback quantity β larger. This would incur, disadvantageously, a decrease in the gain itself as well as a decrease in the power added efficiency (PAE) due to the gain decrease.

In the negative feedback variable-gain power amplification circuit shown in FIG. 13, on the other hand, in which additional control-voltage generating means and input-signal-power detecting means for controlling the feedback quantity are required, the power amplification circuit would be complex in circuitry and moreover hard to downsize, disadvantageously. Further, in order to decrease the distortion for a large input signal power, it becomes necessary to control the gain to a lower one, which would incur a decrease in power added efficiency due to a decrease in gain, as in the case with the negative feedback power amplification circuit of FIG. 11, disadvantageously.

SUMMARY OF THE INVENTION

Therefore, an object of the invention is to provide a power amplification circuit, as well as communication device using the power amplification circuit, which is capable of suppressing gain decreases of a power amplifier due to increase in input signal power in a state near the saturation operation, capable of reducing its size, and low in distortion and high in efficiency.

In order to achieve the above object, in a first aspect of the present invention, there is provided a power amplification circuit comprising a power amplifier and a negative feedback circuit connected between a signal input terminal and a signal output terminal of the power amplifier, wherein impedance of the negative feedback circuit depends on a signal voltage occurring across the negative feedback circuit.

With the power amplification circuit of this constitution, the impedance of the negative feedback circuit connected between the signal input terminal and the signal output terminal of the power amplifier depends on the signal voltage occurring across the negative feedback circuit, and the signal voltage increases, for example, as the input signal power increases. Accordingly, the negative feedback quantity by the negative feedback circuit to the power amplifier is variable depending on input signal power. Thus, by adjusting the variable characteristic, gain fluctuations of the power amplifier due to increases or decreases in the input signal power or output signal power in the vicinity of a specified output signal power can be suppressed, and moreover distortions of the power amplifier in the vicinity of the specified output signal power can be reduced. It is noted that the power amplifier may be of a single stage or multiple stages.

In an embodiment, the impedance of the negative feedback circuit increases as the signal voltage occurring across the negative feedback circuit increases.

With the power amplification circuit of this embodiment, since the impedance of the negative feedback circuit increases with increasing signal voltage across the negative feedback circuit, the negative feedback quantity in the saturation-operation region where the gain of the power amplifier decreases with increasing input signal power can be reduced, allowing gain decreases in the saturation-operation region to be suppressed, so that low-distortion operation and high-efficiency operation of the power amplifier can be achieved at the same time. As a result, it becomes possible to lower the power consumption in the high-output state that, for example, power consumption ratio of the power amplifier in the communication terminal is larger (a state near the saturation operation), which greatly contributes to power consumption reduction of the communication terminal. Further, with this power amplification circuit, there is no need for any additional input-signal-power-detecting-means or negative feedback quantity controlling means, which allows the power amplification circuit to be downsized.

Also, in an embodiment, the negative feedback circuit is a series connection circuit in which a diode and a capacitance device are connected in series.

According to the power amplification circuit of this embodiment, in the series connection circuit composed of the diode and the capacitance device, since the diode has a variable impedance characteristic against the signal voltage thereacross, the impedance of the negative feedback circuit depends on the signal voltage occurring thereacross. Accordingly, the negative feedback quantity by the negative feedback circuit to the power amplifier becomes variable depending on the input signal power. Thus, by adjusting the variable characteristic, gain fluctuations of the power amplifier due to increases or decreases in the input signal power or output signal power in the vicinity of a specified output signal power can be suppressed, and moreover distortions of the power amplifier in the vicinity of a specified output can be reduced. Also, since the direct current path between the signal output terminal and the signal input terminal of the power amplifier by the negative feedback circuit is shut off by the capacitance device, the bias state of the power amplifier is never disturbed. Further, according to this power amplification circuit, it is unnecessary to apply a DC bias to the diode, eliminating the need for any additional bias circuit for the diode. Further, according to this power amplification circuits there is no need for any additional input-signal-power detecting means or negative feedback quantity controlling means, which allows the power amplification circuit to be downsized.

Also, in an embodiment, the negative feedback circuit is a series connection circuit in which a diode, a capacitance device and a feedback resistor are connected in series.

According to the power amplification circuit of this embodiment, the absolute value of the negative feedback quantity and the rate of change of impedance of the negative feedback circuit can arbitrarily set by adjusting the resistance value of the feedback resistor.

Also, in an embodiment, the negative feedback circuit is a series connection circuit in which a first diode and a second diode are connected to each other in series so that their forward directions are opposed to each other.

According to the power amplification circuit of this embodiment, in the series connection circuit in which the first diode and the second diode are connected in series so that their forward directions are opposed to each other, the first, second diodes have variable impedance characteristics against voltages thereacross. Therefore, the impedance of the negative feedback circuit depends on a signal voltage occurring thereacross. Therefore, the negative feedback quantity by the negative feedback circuit to the power amplifier becomes variable depending on input signal power. Thus, by adjusting the variable characteristic, gain fluctuations of the power amplifier due to increases or decreases in the input signal power or output signal power in the vicinity of a specified output signal power can be suppressed, and moreover distortions of the power amplifier in the vicinity of the specified output signal power can be reduced. Also, in this power amplification circuit, since the first diode and the second diode are connected so as to be opposed to each other in their forward directions, both diodes are non-conducting in direct current, and the direct current path of the negative feedback circuit between the signal output terminal and the signal input terminal of the amplifier is shut off. Thus, without providing any additional capacitance device, the bias state of the power amplifier is never disturbed. Further, according to this power amplification circuit, it is unnecessary to apply a DC bias to the first, second diodes, eliminating the need for any additional bias circuit for the diodes. Further, according to this power amplification circuit, there is no need for any additional input-signal-power detecting means or negative feedback quantity controlling means, which allows the power amplification circuit to be downsized.

Also, in an embodiment, the first and second diodes of the series connection circuit are constituted of a base-emitter junction and a base-collector junction of one bipolar transistor, respectively.

As the power amplifier, the bipolar transistors or field effect transistors formed with the use of semiconductors such as silicon or gallium arsenide are used. Therefore, according to the power amplification circuit of this embodiment, when a base-emitter junction and a base-collector junction of one bipolar transistor are used as the first, second diodes, these junctions are connected in opposite directions to each other within the bipolar transistor, thus having the same functions as the series connection circuit of the first, second diodes. Further, since the bipolar transistor or field effect transistor as the power amplifier and the bipolar transistor as the first, second diodes can be formed on the same semiconductor substrate, the power amplification circuit can be downsized.

Also, in an embodiment, the first and second diodes of the series connection circuit are constituted of a junction between two terminals out of base, collector and emitter of a first bipolar transistor, and a junction between two terminals out of base, collector and emitter of a second bipolar transistor, respectively.

According to the power amplification circuit of this embodiment, since the two bipolar transistors constituting the series connection circuit and functioning as the first, second diodes can be set in size or the like independently of each other, the first, second diodes can be set in characteristics independently of each other, thus allowing the negative feedback quantity variable characteristic with higher degree of freedom to be obtained. Further, since the amplification-use bipolar transistor or field effect transistor as the power amplifier and the two bipolar transistors constituting the series connection circuit and functioning as the first and second diodes can be formed on the same semiconductor substrate, the power amplification circuit can be downsized.

Also, in an embodiment, the first and second diodes of the series connection circuit are constituted of a junction between two terminals out of gate, drain and source of a first field effect transistor, and a junction between two terminals out of gate, drain and source of a second field effect transistor, respectively.

According to the power amplification circuit of this embodiment, since the two field effect transistors constituting the series connection circuit and functioning as the first and second diodes can be set in size or the like independently of each other, the first, second diodes can be set in characteristics independently of each other, thus allowing the negative feedback quantity variable characteristic with higher degree of freedom to be obtained. Further, since the bipolar transistor or field effect transistor as the power amplifier and the two field effect transistors constituting the series connection circuit and functioning as the first, second diodes can be formed on the same semiconductor substrate, the power amplification circuit can be downsized.

Also, in an embodiment, the second diode has a junction area larger than the first diode.

According to the power amplification circuit of this embodiment, since the first, second diodes are different in junction area from each other, variations of the negative feedback quantity against the signal voltage occurring across the negative feedback circuit can be made larger than those in the case where the first, second diodes are of the same, thus allowing a negative feedback quantity variable characteristic with higher degree of freedom to be obtained. Further, in this power amplification circuit, the negative feedback variations resulting when the first, second diodes have an equal junction area can be achieved with diodes of smaller junction area, so that the power amplification circuit can be downsized. This can be explained as follows.

FIG. 14A shows a circuit in which a diode D1 having a size n (n: positive integer) times larger than a unit junction area and a diode D2 having a size m (m: positive integer) times larger than the unit junction area are connected in series so that their forward directions are opposed to each other. FIG. 14B is a high-frequency equivalent circuit of FIG. 14A, where the diode D1 is represented by a parallel connection circuit of a resistor R1 and a capacitance device C1 and the diode D2 is represented by a parallel connection circuit of a resistor R2 and a capacitance device C2. Now assuming that resistance and capacitance components of the diodes per unit junction area are Ro and Co, respectively, and that the total junction area K of the diodes D1 and D2 are constant, then m=K−n and $$R1 = \frac{Ro}{n}, C1 = nCo$$

$$R2 = \frac{Ro}{K-n}, C2 = (K-n)Co$$

An impedance Za across the diode D1 represented by the parallel connection circuit of the resistor R1 and the capacitance component C1 is $$Za = \frac{R1 \cdot \left(\frac{1}{j\omega C1}\right)}{R1 + \left(\frac{1}{j\omega C1}\right)} = \frac{\frac{Ro}{n} \cdot \frac{1}{j\omega nCo}}{\frac{Ro}{n} + \frac{1}{j\omega C1}} = \frac{1}{n} \cdot \frac{Ro}{(1 + j\omega RoCo)}$$

$$\omega = 2\pi f$$

where f is the frequency of the signal. Similarly, an impedance Zb across the diode D2 represented by the parallel connection circuit of the resistor R2 and the capacitance component C2 is $$Zb = \frac{1}{K-n} \cdot \frac{Ro}{(1+j\omega RoCo)}$$

Therefore, an impedance Z across both ends A-B in the equivalent circuit of FIG. 14B $$Z = Za + Zb$$
$$= \left(\frac{1}{n} + \frac{1}{K-n}\right) \cdot \frac{Ro}{1+j\omega RoCo}$$
$$= A(n) \cdot \frac{Ro - j\omega CoRo^2}{1+(\omega CoRo)^2}$$
$$A(n) = \frac{K}{n(K-n)}$$

Since the resistance Ro and the capacitance component Co of the diodes per unit junction area vary depending on variations in a voltage at an end A or a voltage Vb at an end B because of nonlinearity of diodes, real part and imaginary part of the impedance Z also vary, so that a variable impedance characteristic can be obtained, where the variation quantity is proportional to A(n). If the total junction area K is constant, then A(n) is a function having a minimum point at n=K/2, i.e., n=m under the condition that 0<n<K. Therefore, the variable quantity of the impedance Z can be made larger when the diodes D1 and D2 are different in junction area to each other, than when the diodes D1 and D2 are of the same junction area.

In a second aspect of the present invention, there is provided a power amplification circuit comprising a power amplifier and a negative feedback circuit connected between a grounding terminal of the power amplifier and ground, wherein impedance of the negative feedback circuit depends on a signal voltage occurring across the negative feedback circuit.

With the power amplification circuit of this constitution, the impedance of the negative feedback circuit connected between the grounding terminal of the power amplifier and the ground depends on a signal voltage occurring across the negative feedback circuit, and the signal voltage increases as an input signal power increases. Accordingly, the negative feedback quantity by the negative feedback circuit to the power amplifier is variable depending on input signal power. Thus, by adjusting the variable characteristic, gain fluctuations of the power amplifier due to increases or decreases in the input signal power or output signal power in the vicinity of a specified output signal power can be suppressed, and moreover distortions of the power amplifier in the vicinity of a specified output can be reduced.

In an embodiment, the impedance of the negative feedback circuit decreases as the signal voltage occurring across the negative feedback circuit increases.

According to the power amplification circuit of this embodiment, since the impedance of the negative feedback circuit decreases with increasing signal voltage across the negative feedback circuit, the negative feedback quantity in the saturation-operation region where the gain of the power amplifier decreases with increasing input signal power can be reduced, allowing gain decreases in the saturation-operation region to be suppressed, so that low-distortion operation and high-efficiency operation of the power amplifier can be achieved at the same time. As a result, it becomes possible to lower the power consumption in the high-output state that, for example, power consumption ratio of the power amplifier in the communication terminal is larger (a state near the saturation operation), which greatly contributes to power consumption reduction of the communication terminal. Further, with this power amplification circuit, there is no need for any additional input-signal-power detecting means or negative feedback quantity controlling means, which allows the power amplification circuit to be downsized.

In an embodiment, the negative feedback circuit is a series connection circuit in which a diode and a capacitance device are connected in series or a series connection circuit in which a diode, a capacitance device and a feedback resistor are connected in series, a connecting point between the diode and the capacitance device is grounded via a grounding resistor, and a bias power supply for the power amplifier is connected to one end of the series connection circuit so that the diode is biased.

According to the power amplification circuit of this embodiment, the connecting point between the diode and the capacitance device is grounded via a grounding resistor, and the bias power supply for the power amplifier is connected to one end of the series connection circuit, so that the path running from the bias power supply through the diode and the grounding resistor to the ground (in some cases, a feedback resistor may be included in the path) is made conducting in direct current, by which a bias is applied to the diode by the bias power supply. Then, the bias for the diode is adjusted by adjusting the voltage value of the bias power supply or the resistance value of the grounding resistor, the variable impedance characteristic depending on the signal voltage across the diode can be set with higher degree of freedom, so that distortions of the amplifier can be further reduced. Also, in the case where the negative feedback circuit is a series connection circuit composed of a diode, a capacitance device and a feedback resistor, the absolute value of the negative feedback quantity and the rate of change of impedance of the negative feedback circuit can arbitrarily set by adjusting the resistance value of the feedback resistor.

In an embodiment, the diode is constituted of a junction between two terminals out of base, collector and emitter of a bipolar transistor.

According to the power amplification circuit of this embodiments in the case where a bipolar transistor is used as an amplification device of the power amplifier, constituting the diode by a junction between two terminals out of base, collector and emitter of the bipolar transistor makes it possible to manufacture the bipolar transistor, which is to be used as a diode, in the same manufacturing process as the bipolar transistor serving as the amplification device. Thus, without increasing manufacturing processes, the negative feedback circuit can be manufactured simultaneously in the manufacturing process of the power amplifier.

In an embodiment, the power amplifier is constituted of a bipolar transistor, the bipolar transistor constituting the diode and the bipolar transistor used for the power amplifier are generally equal to one another in bias-current temperature characteristics.

According to the power amplification circuit of this embodiment, since the bipolar transistor forming the diode and the bipolar transistor used for the power amplifier are generally equal to one another in bias-current temperature characteristics, a temperature-compensated stable operation can be achieved.

Also, in an embodiment, the diode is constituted of a junction between two terminals out of gate, drain and source of a field effect transistor.

According to the power amplification circuit of this embodiment, characteristics of the diode can be set by setting the size or the like of the field effect transistors constituting the series connection circuit and functioning as diodes, allowing the negative feedback quantity variable characteristic with higher degree of freedom to be obtained. Further, since the bipolar transistor or field effect transistor as the power amplifier and the field effect transistor constituting the diode can be formed on the same semiconductor substrate, the power amplification circuit can be downsized.

Furthermore, in a third aspect of the present invention, there is provided a communication device in which the power amplification circuit as described above is used for a transmitting section.

With the communication device of this constitution, the use of the power amplification circuit for the transmitting section makes it possible to downsize the communication device and to amplify a transmitting signal with low distortion and low power consumption, so that the communication device can be lowered in power consumption. For example, in the case of battery-driven portable terminals using lithium ion batteries or nickel hydrogen batteries or the like, typified by cellular phones, as an example of the communication device, it is important to extend the communication time lasting the battery exhaustion, where using this power amplification circuit produces particularly great effects. Further, if the communication time is not changed, smaller-size batteries become usable, which allows the communication device to be downsized.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Hereinbelow, a power amplification circuit and a communication device using the power amplification circuit of the present invention are described in detail by way of embodiments thereof illustrated in the accompanying drawings.

First Embodiment

Figure 1:
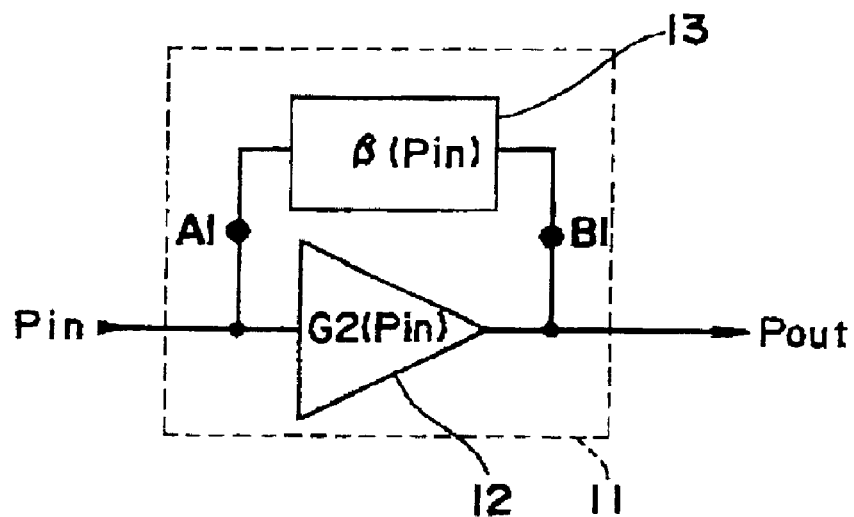
FIG. 1 is a circuit diagram of a power amplification circuit in a first embodiment of the invention.

FIG. 1 shows a circuit diagram of a power amplification circuit 11 in a first embodiment of the present invention. As shown in FIG. 1, this power amplification circuit 11 is made up of a power amplifier 12, and a parallel negative feedback circuit 13 connected between a signal input terminal and a signal output terminal of the power amplifier 12. The parallel negative feedback circuit 13 has an impedance Z1 between A1 and B1 at its both sides. An input signal power Pin fed to the signal input terminal of the power amplifier 12 is amplified by the power amplification circuit 11 and put out as an output signal power Pout. It is noted here that the gain of the power amplifier 12, which depends on the input signal power Pin, is expressed as G2(Pin). Also, the feedback quantity of the parallel negative feedback circuit 13, which depends on the input signal power Pin, is expressed as β(Pin). The gain of this power amplification circuit 11, when expressed as G1(Pin) as a function of the input signal power Pin, can be expressed as $$G1(Pin) = \frac{G2(Pin)}{1 + G2(Pin)\beta(Pin)} \quad \text{(Eq. 3)}$$

and a gain change due to the input signal power Pin is $$\frac{dG1(Pin)}{dPin} = \frac{\frac{dG2(Pin)}{dPin} - G2(Pin)^2 d\frac{\beta(Pin)}{dPin}}{(1 + G2(Pin)\beta(Pin))^2} \quad \text{(Eq. 4)}$$

Therefore, when the variable characteristic of the impedance Z1 is so set that, upon output of the specified output signal power Pout, the variable characteristic of the feedback quantity β becomes closer to a state that the relation $$\frac{d\beta(Pin)}{dPin} = (G2(Pin))^{-2}\frac{dG2(Pin)}{dPin}$$

is satisfied, the numerator of Equation 4 becomes nearly zero. Thus, the power amplification circuit 11 in which fluctuations of the gain G1(Pin) due to the input signal power Pin are suppressed can be realized.

Figure 11:
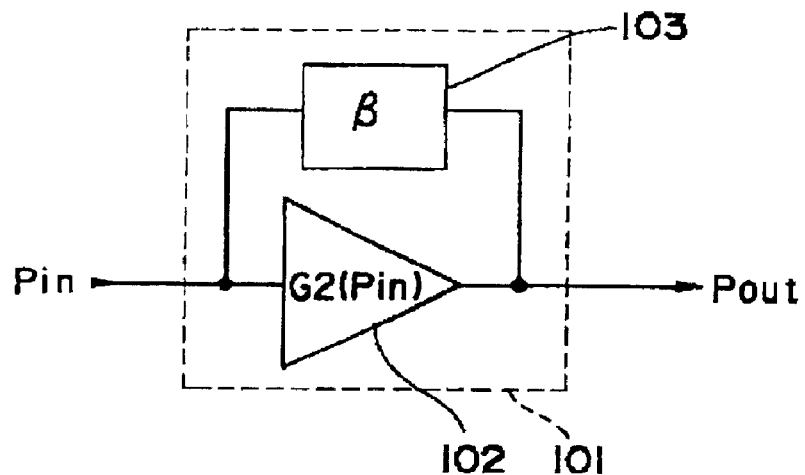
FIG. 11 is a circuit diagram of a power amplification circuit of the prior art.
Figure 12:
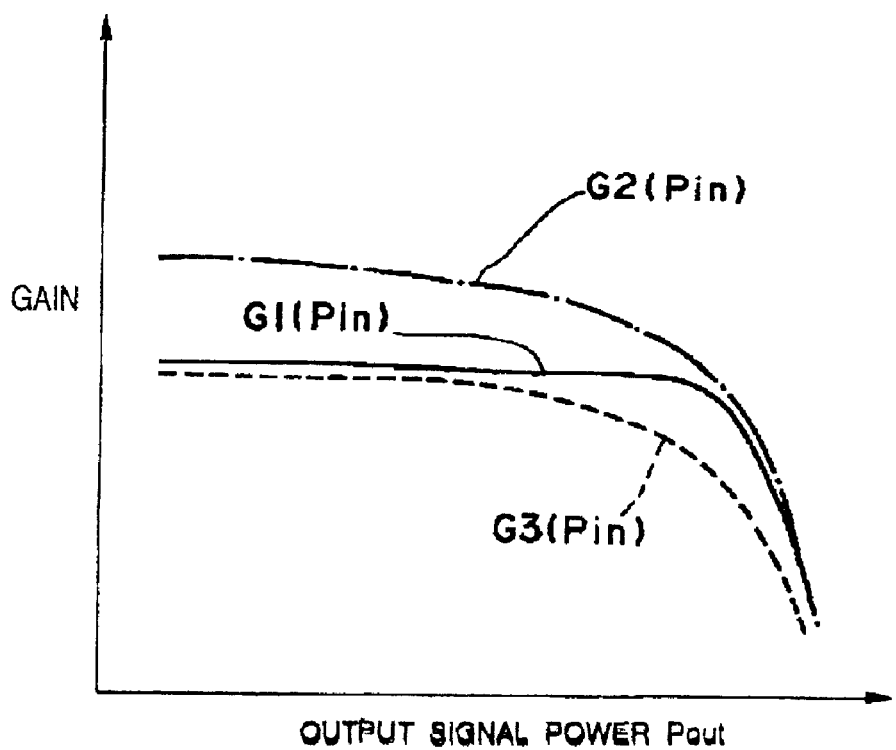
FIG. 12 is a view showing the output signal power dependence of the gain in the power amplification circuit of the invention and the power amplification circuit of the prior art.
Figure 13:
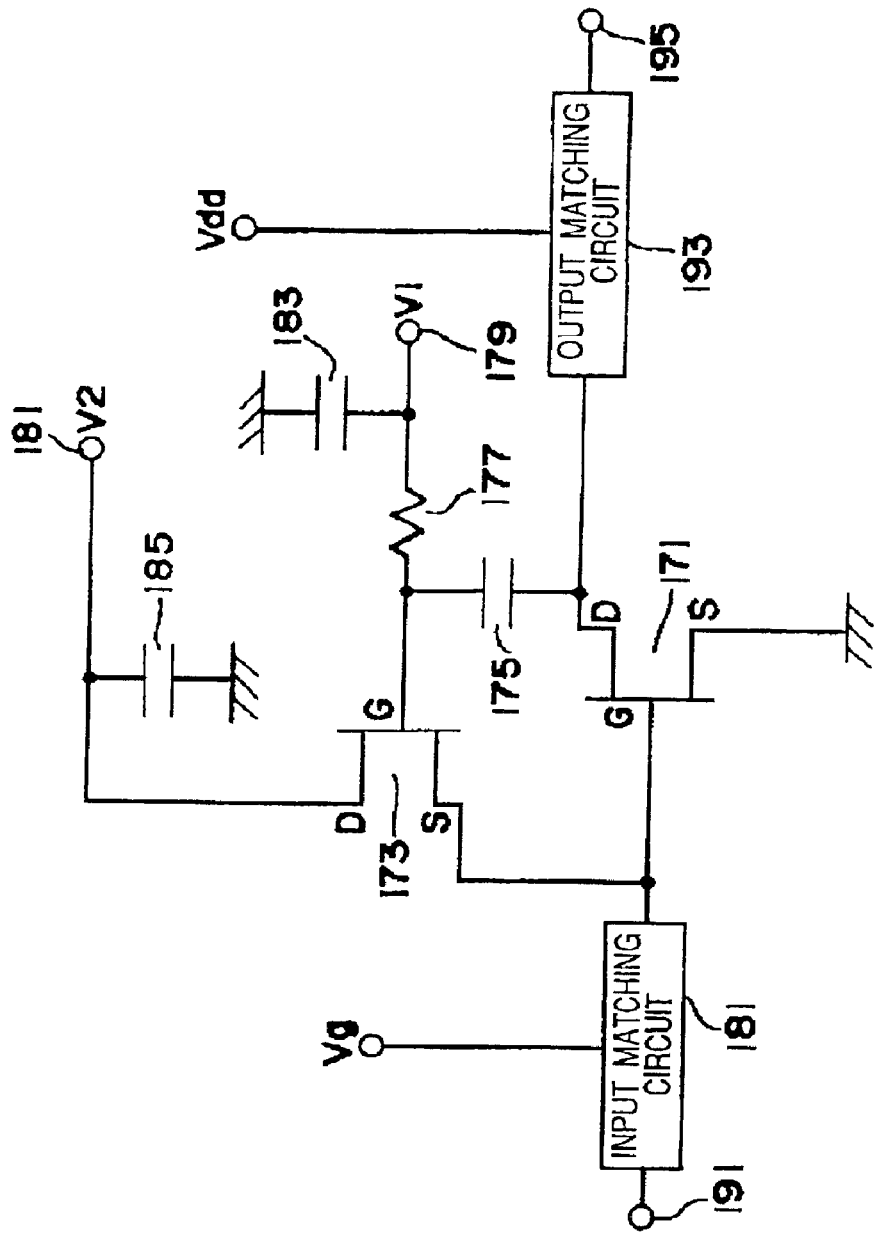
FIG. 13 is a circuit diagram of another power amplification circuit of the prior art.
Figure 14A:
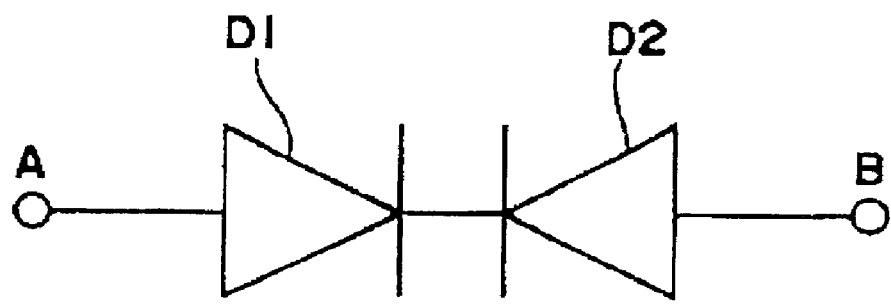
FIG. 14A is a view showing a series connection circuit of diodes and FIG. 14B is a view showing a high-frequency equivalent circuit of the series connection circuit.
Figure 14B:
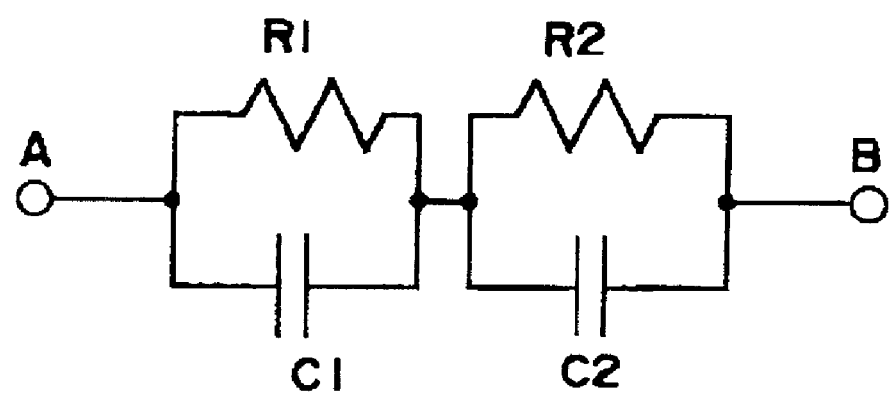

Meanwhile, radio communication terminals such as cellular phones involve high transmission power, having given rise to a large problem of distortion which matters when the power amplification circuit 11 comes near its saturation operation. In such a state around the saturation operation, the gain of the amplifier monotonously decreases with increasing input signal power. Accordingly, as a preferable embodiment of the present invention, an impedance device the impedance Z1 of which increases with increasing input signal power Pin is used. As a consequence, with regard to the difference in the output signal power Pout dependence of gain from the prior art, as shown in FIG. 12, since the parallel negative feedback quantity β(Pin) decreases with the input signal power Pin increased, the negative feedback loop gain G2(Pin)β(Pin) near the saturation operation becomes smaller than the conventional fixed β shown in FIG. 11, so that the decrease in the gain G1(Pin) is suppressed to a higher output signal power Pout, compared with the conventional gain G3(Pin).

Thus, a power amplification circuit which is capable of low-distortion operation even with the power amplifier 12 in an operation near the saturation operation and which is low in distortion and high in efficiency can be realized. Also, since gain decreases due to increases in the input signal power Pin in the vicinity of the saturation output can be suppressed by the variable characteristic of negative feedback quantity, it also becomes possible to obtain a high gain while maintaining low distortion by making the absolute value of the feedback quantity smaller than that of the negative feedback power amplification circuit 13 of the prior art. Further, according to this power amplification circuit 11 of the first embodiment, there is no need for any additional input-signal-power detecting means or negative feedback quantity controlling means, which allows the power amplification circuit 11 to be downsized.

Second Embodiment

Figure 2:
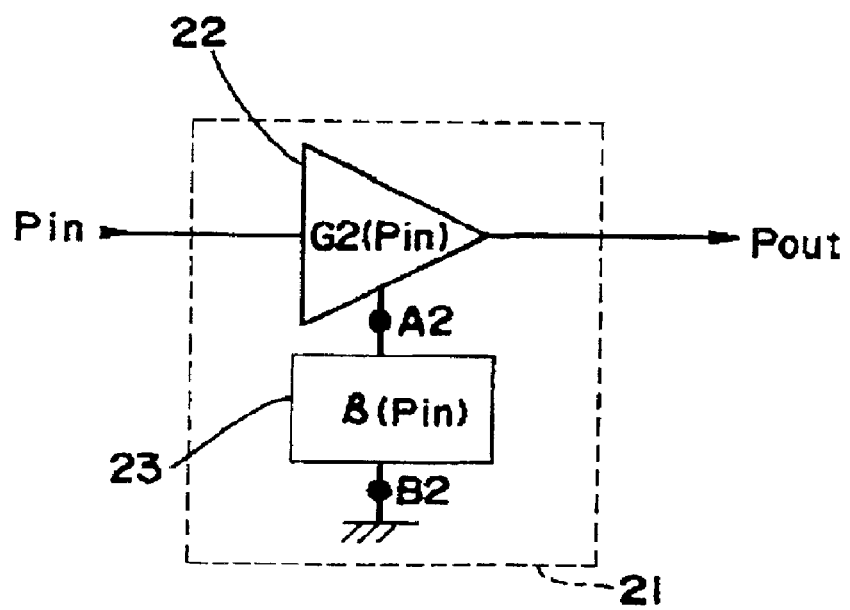
FIG. 2 is a circuit diagram of a power amplification circuit in a second embodiment of the invention.

FIG. 2 is a circuit diagram of a power amplification circuit 21 in a second embodiment of the invention. As shown in FIG. 2, this power amplification circuit 21 is made up of a power amplifier 22, and a serial negative feedback circuit 23 connected between a grounding terminal of the power amplifier 22 and the ground. The serial negative feedback circuit 23 is an impedance device having an impedance Z2 between A2 and B2 at its both sides. An input signal power Pin fed to the signal input terminal of the power amplifier 22 is amplified by the power amplification circuit 21 and put out as an output signal power Pout. It is noted here that the gain of the power amplifier 22, which depends on the input signal power Pin, is expressed as G2(Pin). Also, the feedback quantity β of the serial negative feedback circuit 23, which depends on the input signal power Pin, is expressed as β(Pin). In the case of serial negative feedback, the feedback quantity β depends on the signal voltage occurring between A2 and B2, where the feedback quantity decreases with decreasing impedance Z2 between A2 and B2. The gain of this power amplification circuit 21, when expressed as G1(Pin) as a function of the input signal power Pin, can be expressed as $$G1(Pin) = \frac{G2(Pin)}{1 + G2(Pin)\beta(Pin)}$$

as in the case of the first embodiment. Therefore, when the variable characteristic of the impedance Z2 is so set that, upon output of the specified output signal power Pout, the variable characteristic of the feedback quantity β becomes closer to a state that the relation $$\frac{d\beta(Pin)}{dPin} = G2(Pin)\frac{dG2(Pin)}{dPin}$$

is satisfied, a low-distortion power amplification circuit in which fluctuations of the gain G1(Pin) due to the input signal power Pin are largely suppressed can be realized, as in the first embodiment.

Further, as a preferable embodiment of the present invention, an impedance device the impedance Z2 of which decreases with increasing input signal power Pin is used.

As a consequence, since the serial negative feedback quantity β(Pin) decreases with the input signal power Pin increased, the negative feedback loop gain G2(Pin)β(Pin) in the vicinity of the saturation operation becomes smaller than the conventional fixed β, so that the decrease in the gain G1(Pin) is suppressed to a higher output signal power Pout.

Thus, the power amplification circuit 21 which is capable of low-distortion operation even with the power amplifier 22 in an operation near the saturation operation and which is low in distortion and high in efficiency can be realized. Also, since gain decreases due to increases in the input signal power Pin in the vicinity of the saturation operation can be suppressed by the variable characteristic of negative feedback quantity, it also becomes possible to obtain a high gain while maintaining low distortion by making the absolute value of the feedback quantity smaller than that of the negative feedback power amplification circuit of the prior art. Further, according to this power amplification circuit of the second embodiment, there is no need for any additional input-signal-power detecting means or negative feedback quantity controlling means, which allows the power amplification circuit 21 to be downsized.

Third Embodiment

Figure 3:
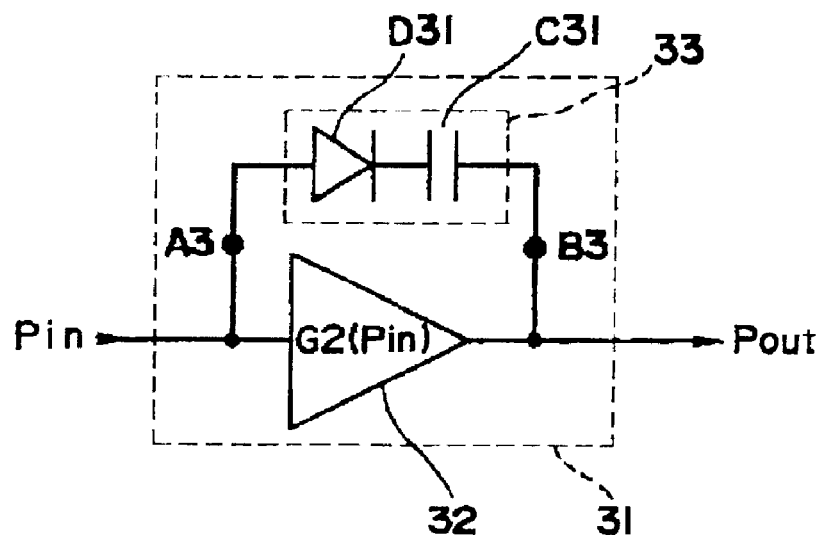
FIG. 3 is a circuit diagram of a power amplification circuit in a third embodiment of the invention.

FIG. 3 shows a circuit diagram of a power amplification circuit in a third embodiment of the invention. This power amplification circuit of the third embodiment is made up by using a parallel negative feedback circuit 33 composed of a series connection circuit of a diode D31 and a capacitance device C31 in place of the parallel negative feedback circuit 13 of the power amplification circuit of the first embodiment shown in FIG. 1. Since the diode D31 has a variable impedance characteristic to the signal voltage thereacross, the impedance of the negative feedback circuit 33 depends on the signal voltage occurring across the negative feedback circuit 33.

Therefore, the negative feedback quantity to a power amplifier 32 is variable depending on the input signal power, so that gain fluctuations of the power amplifier 32 due to increases or decreases in the input signal power or output signal power in the vicinity of the specified output signal power can be suppressed by adjusting the variable characteristic, and so that any distortion of the power amplifier 32 in the vicinity of the specified output signal power can be reduced. Also, since the direct current path of the parallel negative feedback circuit between the signal output terminal and the signal input terminal of the power amplifier 32 is shut off by the capacitance device C31, the bias state of the power amplifier 32 is never disturbed. Further, according to this power amplification circuit, it is unnecessary to apply a DC bias to the diode D31, eliminating the need for any additional bias circuit for the diode. Further, according to this power amplification circuit, there is no need for any additional input-signal-power detecting means or negative feedback quantity controlling means, which allows the power amplification circuit 31 to be downsized.

Also, the absolute value of an impedance Z3 between A3 and B3 of the parallel negative feedback circuit 33 and the rate of change of the impedance Z3 between A3 and B3 due to the nonlinearity of the diode D31 depend also on the capacitance value of the capacitance device C31. More specifically, reducing the capacitance value causes the feedback quantity to decrease so that the gain of the power amplification circuit 31 is increased while the variation in feedback quantity against the input signal power Pin is decreased. Accordingly, this capacitance value of the capacitance device C31 is set as a design item of this power amplification circuit 31, as required, in compliance with required gain, output and distortion characteristics.

Fourth Embodiment

Figure 4:
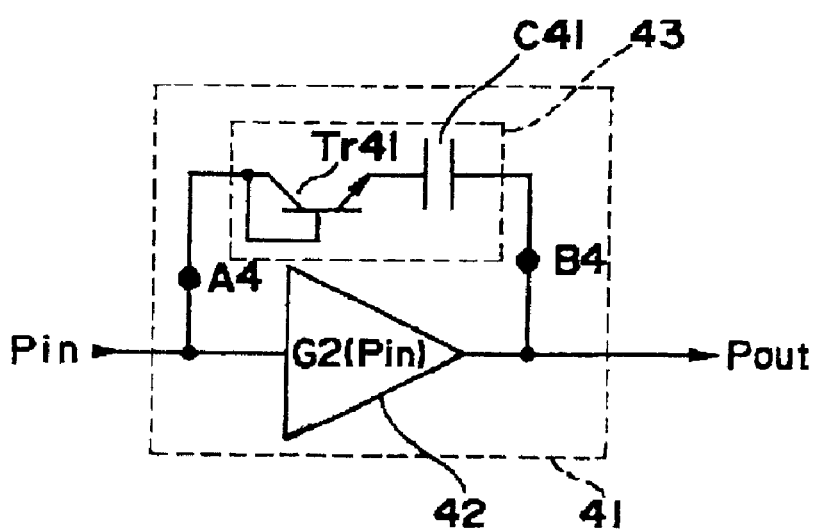
FIG. 4 is a circuit diagram of a power amplification circuit in a fourth embodiment of the invention.

FIG. 4 is a circuit diagram of a power amplification circuit in a fourth embodiment of the invention. This power amplification circuit of the fourth embodiment is made up by using a base-emitter junction of a bipolar transistor Tr41 in place of the diode D31 of the power amplification circuit of the third embodiment shown in FIG. 3. The collector of the bipolar transistor Tr41, although connected to the base in this fourth embodiment, may also be in the open state. Also, a base-collector junction of the bipolar transistor Tr41 may be used as the diode. Further, it is also possible to use a field effect transistor in place of the bipolar transistor Tr41, where the field effect transistor is connected with its gate, drain and source corresponding to the base, collector and emitter of the bipolar transistor Tr41, respectively, and with the gate-source junction or gate-drain junction used as the diode.

Figure 5:
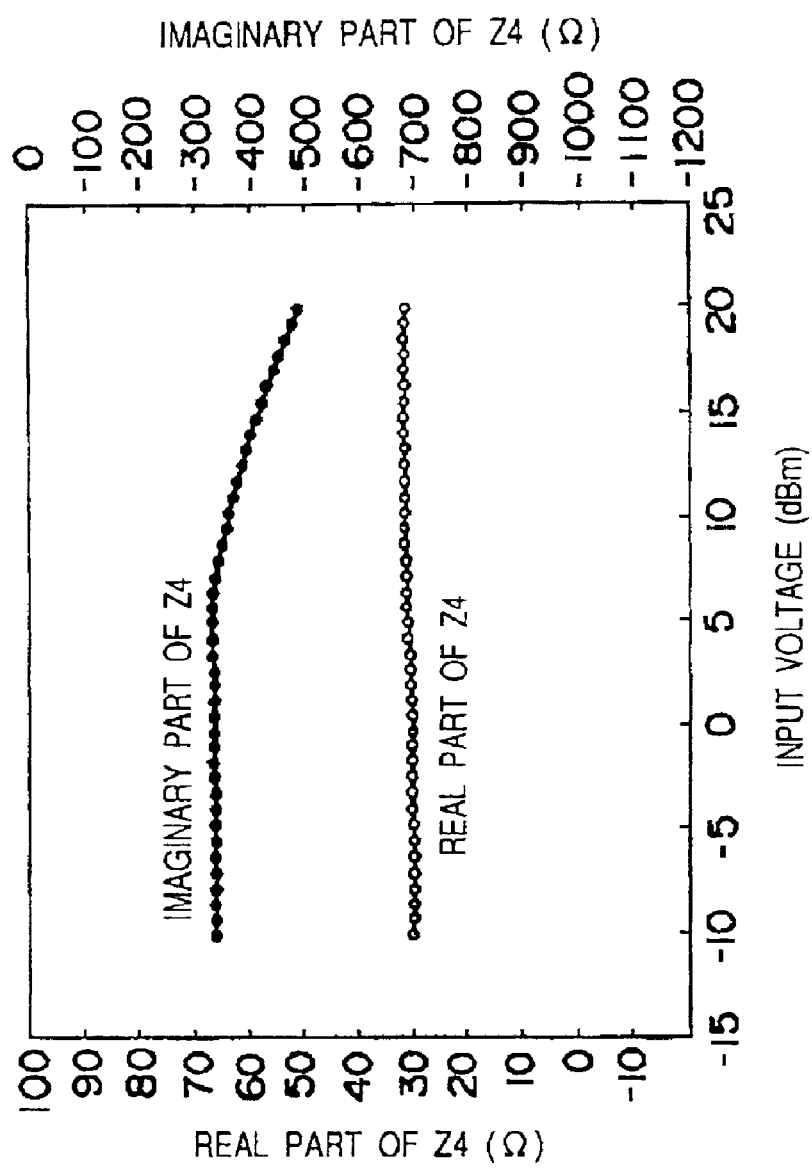
FIG. 5 is a view showing the input signal power dependence of the impedance of a parallel negative feedback circuit of the power amplification circuit.

FIG. 5 shows the input signal power dependence of the impedance Z1 with respect only to the parallel negative feedback circuit 43 in FIG. 4, with its one end B4 grounded and with a signal fed to the other end A4, as viewed from the A4 end. In this case, the signal frequency is 1.95 GHz, the capacitance value of a capacitance device C41 is 3 pF, a gallium arsenide HBT (Heterojunction Bipolar Transistor) is used as the bipolar transistor Tr41, and the base-emitter junction area is 102.4 $\mu m^2$. According to FIG. 5, as the input signal power increases, the real part of an impedance Z4 between A4 and B4 keeps almost unchanged, while its imaginary part increases in absolute value. Therefore, this parallel negative feedback circuit 43 has its impedance Z4 increased with increasing input signal power Pin of the power amplifier 42, causing the feedback quantity to decrease. Thus, gain decreases in the vicinity of the saturation operation of the power amplification circuit 41 in this fourth embodiment is suppressed, so that the power amplification circuit 41 capable of high-efficiency operation can be realized.

Fifth Embodiment

Figure 6:
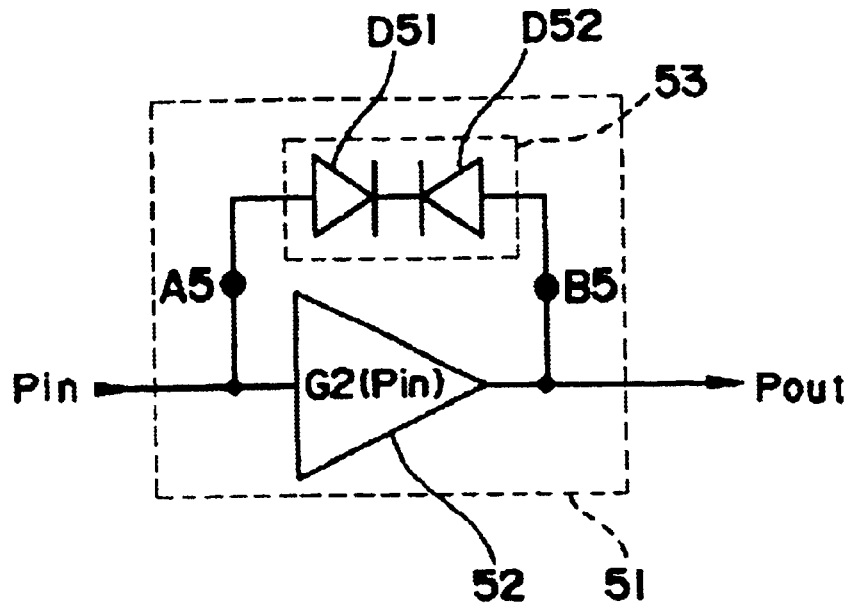
FIG. 6 is a circuit diagram of a power amplification circuit in a fifth embodiment of the invention.

FIG. 6 shows a circuit diagram of a power amplification circuit in a fifth embodiment of the invention. This power amplification circuit of the fifth embodiment is made up by using a first diode D51 and a second diode D52 connected in series so that their forward directions are opposed to each other in place of the parallel negative feedback circuit 13 of the power amplification circuit of the first embodiment shown in FIG. 1.

The diodes D51, D52 each have such a variable impedance characteristic to the signal voltage thereacross that the impedance of the diodes D51, D52 varies depending on an input signal power of a power amplifier 52 or an output-end signal voltage of the power amplifier 52 responsive to the output signal power, making the negative feedback quantity to the power amplifier 52 variable. Thus, gain fluctuations of the power amplifier 52 due to input signal power or output signal power in the vicinity of the specified output signal power can be suppressed by adjusting the variable characteristic, and moreover distortions of the power amplification circuit 51 in the vicinity of the specified output signal power can be reduced. Further, in this fifth embodiment, since the diodes D51, D52 are connected to each other in reverse-bias directions, each diode is non-conducting in direct current, so that the direct current path of the parallel negative feedback circuit 53 between signal output terminal and signal input terminal of the power amplifier 52 is shut off. Thus, even without providing a capacitance device that has been added in the third and fourth embodiments, the bias state of the power amplifier 52 is not disturbed. Also, according to this power amplification circuit 51, it is unnecessary to apply a DC bias to the diodes, nor is necessary any additional bias circuit for the diodes. Further, according to this power amplification circuit 51, there is no need for any additional input-signal-power detecting means or negative feedback quantity controlling means, which allows the power amplification circuit 51 to be downsized.

Sixth Embodiment

Figure 7A:
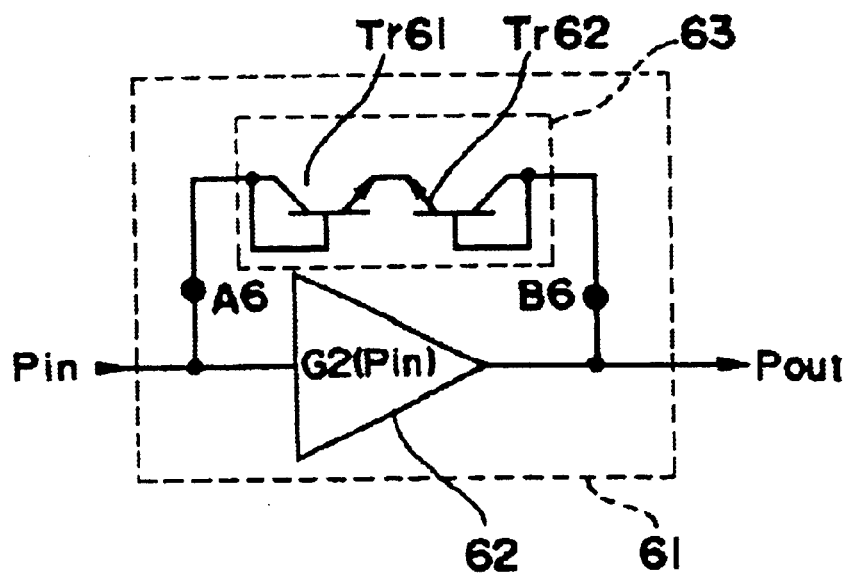
FIGS. 7a and 7b represent circuit diagrams of a power amplification circuit in a sixth embodiment of the invention.
Figure 7B:
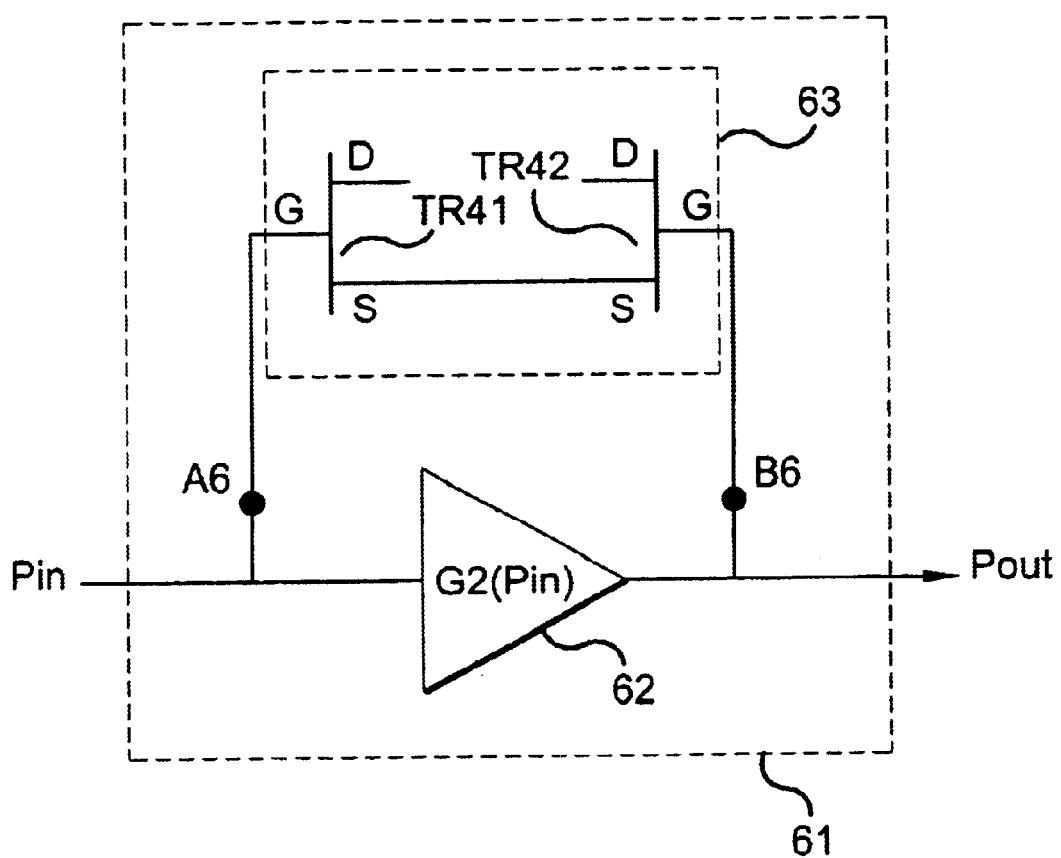

FIGS. 7a and 7b illustrate circuit diagrams of a power amplification circuit 61 in a sixth embodiment of the invention. In FIG. 7a, this power amplification circuit 61 of the sixth embodiment is made up by using base-emitter junctions of a first bipolar transistor Tr61 and a second bipolar transistor Tr62 in place of the diodes D51, D52 of the power amplification circuit 51 of the fifth embodiment shown in FIG. 6. In this sixth embodiment, Tr61 and Tr62's collectors are short-circuited to their bases, respectively, but those collectors may be in the open state. Also, base-collector junctions of bipolar transistors may be used as the diodes. Further, as shown in FIG. 7b, it is also possible to use field effect transistors in place of the first, second bipolar transistors Tr61, Tr62, where the field effect transistors are connected with their gates, drains and sources corresponding to the bases, collectors and emitters of the first, second bipolar transistors Tr61, Tr62, respectively, and with the gate-source junctions or gate-drain junctions used as the diodes.

Figure 8:
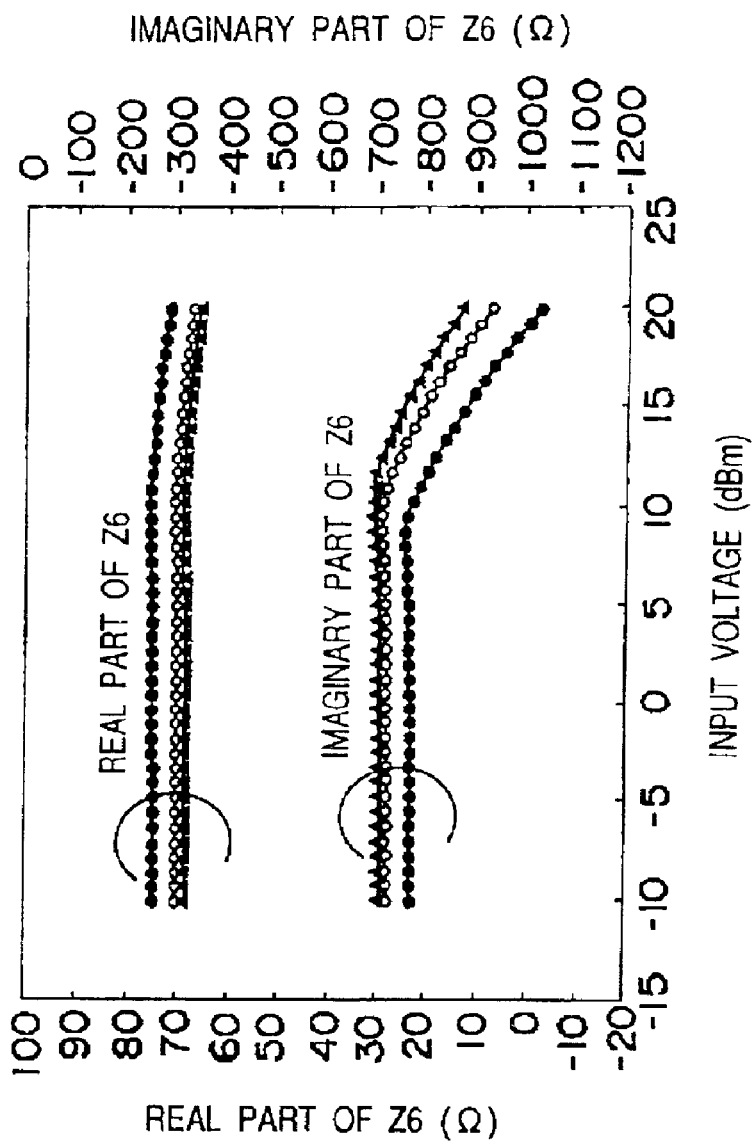
FIG. 8 is a view showing the input signal power dependence of the impedance of a parallel negative feedback circuit of the power amplification circuit.

FIG. 8 shows the input signal power dependence of an impedance Z6 with respect only to a parallel negative feedback circuit 63 shown in FIG. 7, with its one end B6 grounded and with a signal fed to the other end A6, as viewed from the A6 end. Here is shown a case where the signal frequency is 1.95 GHz, gallium arsenide HBTs are used as the first, second bipolar transistors Tr61, Tr62, and the base-emitter junction area is 179.2 $\mu m^2$ constant as a total area of the first, second bipolar transistors Tr61, Tr62 and the base-emitter junction area ratios of first, second bipolar transistors Tr61, Tr62 are (9:5), (8:6) and (1:1). In FIG. 8, black circles represent real part and imaginary part of the impedance Z6 resulting when the base-emitter junction area ratio is (9:5), white circles represent those of the impedance Z6 resulting when the base-emitter junction area ratio is (8:6), and black triangles represent those of the impedance Z6 resulting when the base-emitter junction area ratio is (1:1).

According to FIG. 8, as the input signal power increases, the real part of the impedance Z6 keeps almost unchanged, while its imaginary part increases in absolute value. Therefore, this parallel negative feedback circuit 63 has its impedance Z6 increased with increasing input signal power Pin of the power amplifier 62, causing the feedback quantity to decrease. Thus, gain decreases due to increases in the input signal power Pin in the vicinity of the saturation operation of the power amplification circuit 61 is suppressed, so that the power amplification circuit 61 capable of high-efficiency operation can be realized. Also, impedance variation due to an increase in the input signal power is larger when the base-emitter junction area ratio of the first, second bipolar transistors Tr61, Tr62 is shifted from (1:1) than not, so that the variation in negative feedback quantity of the negative feedback circuit 63 against the signal voltage thereacross can be increased, and that a negative feedback variable characteristic of higher degree of freedom can be obtained. Furthermore, in this sixth embodiment, variations in negative feedback of the negative feedback circuit 53 of the fifth embodiment against the voltage thereacross under the condition that the first, second diodes D51, D52 are of the same can be achieved by base-emitter junctions of the transistors Tr61, Tr62 of smaller junction areas, which allows the power amplification circuit 61 to be downsized.

Seventh Embodiment

Figure 9:
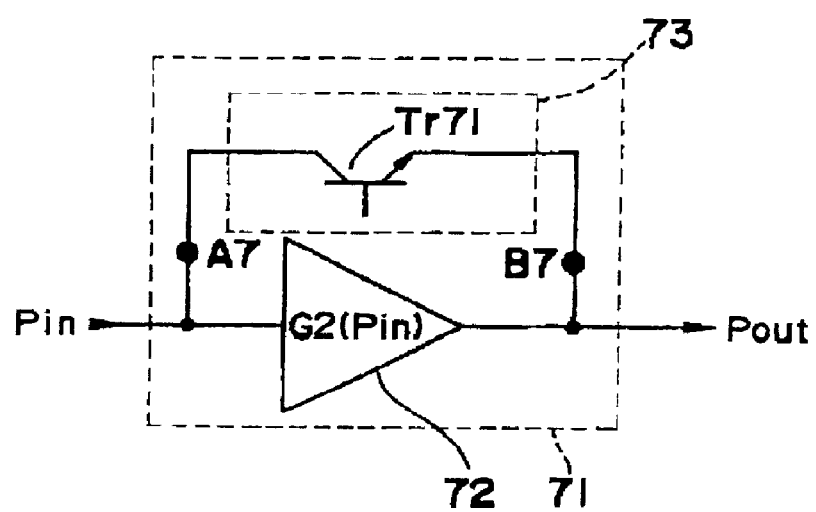
FIG. 9 is a circuit diagram of a power amplification circuit in a seventh embodiment of the invention.

FIG. 9 shows a circuit diagram of a power amplification circuit 71 in a seventh embodiment of the invention. This power amplification circuit 71 of the seventh embodiment is made up by using a base-collector junction and a base-emitter junction of one bipolar transistor Tr71 in place of the diodes D51, D52 of the power amplification circuit 51 of the fifth embodiment shown in FIG. 6. The base itself of the bipolar transistor Tr71 is in the open state. According to this power amplification circuit 71 of the seventh embodiment, there is no need for using a plurality of transistors unlike the power amplification circuit 61 of the sixth embodiment, and moreover the number of electrodes for connection with the external that need to be provided at individual terminals of base, emitter and collector of the transistor can be reduced. Thus, the parallel negative feedback circuit 73 becomes downsizable.

In the first to seventh embodiments described above, bipolar transistors or field effect transistors formed with the use of semiconductors such as silicon or gallium arsenide are used as amplification devices constituting a power amplifier. Therefore, by using base-emitter or base-collector junction of bipolar transistors or gate-source or gate-drain junction of field effect transistors as diodes as in the foregoing embodiments, these diodes can be formed on the same semiconductor substrate as the bipolar transistor or field effect transistor for amplification use, which allows the power amplification circuit to be easily downsized.

Further, the power amplification circuits of the foregoing first to seventh embodiments produce effects of high-efficiency operation particularly when used in mobile communications systems typified by cellular phones or in battery-operated radio communications systems for use in radio LAN (Local Area Network) systems or the like.

Eighth Embodiment

Figure 10:
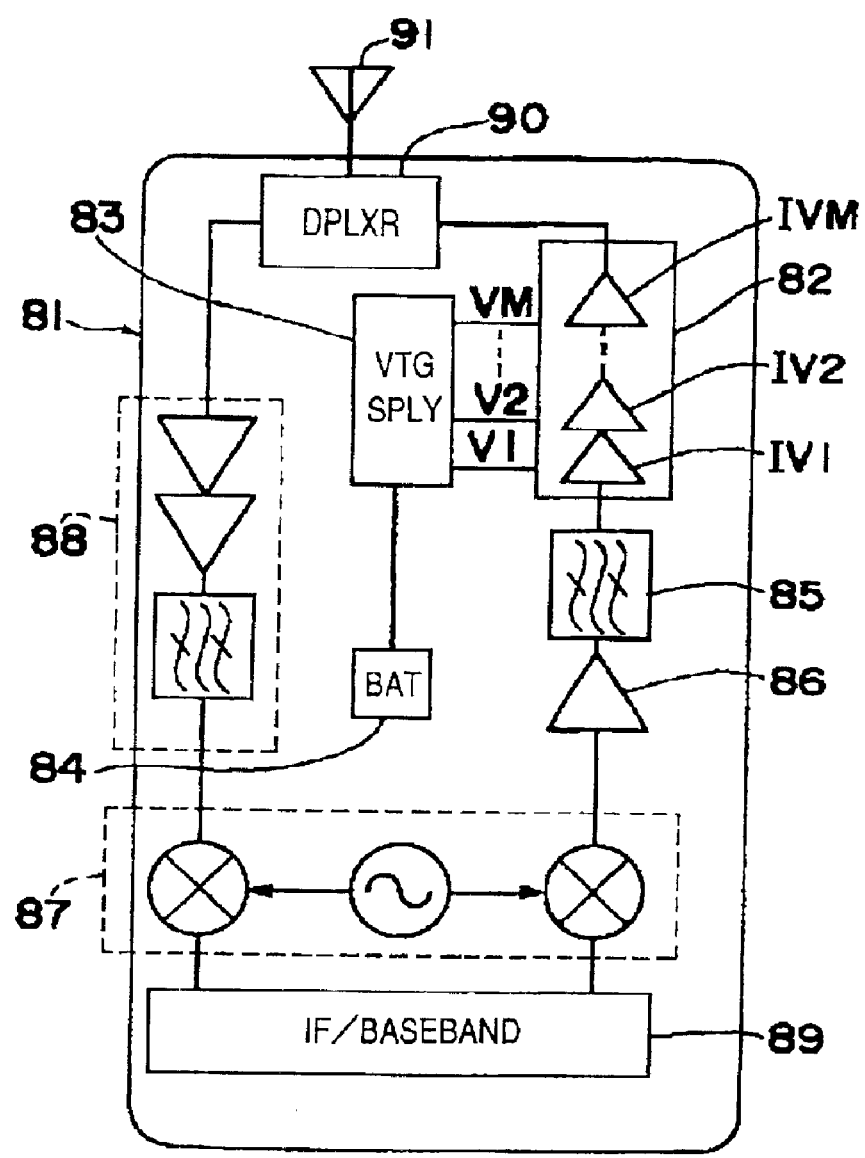
FIG. 10 is a block diagram of a communication device using a power amplification circuit in an eighth embodiment of the invention.

FIG. 10 shows a communication device 81 in an eighth embodiment of the invention. As shown in FIG. 10, this communication device 81 includes a power amplifier stage 82, a voltage supply 83, a battery 84 as a main power supply of the communication device (although not shown, this battery drives individual circuit sections within the communication device), a filter 85, a driver amplifier stage 86, a frequency conversion section 87 for converting an RF (Radio Frequency) signal into an IF (Intermediate Frequency) signal, a reception-use RF section 88 composed of a low-noise amplifier, a filter and the like, an IF/baseband section 89, a duplexer 90, and an antenna 91. The power amplifier stage 82, the voltage supply 83, the battery 84, the filter 85 and the driver amplifier stage 86 constitute a transmitting section.

The power amplifier stage 82 is composed of power amplifiers $IV_1$–$IV_M$ in a number of N stages corresponding to a gain that allows a specified antenna output to be obtained. In this case, any one of the power amplification circuits of the first to seventh embodiments is used as at least one of the driver amplifier stage 86 and the power amplifiers $IV_1$–$IV_M$. Also, bias voltages $V_1, V_2, \ldots, V_M$ that make the power amplifier stage 82 operative are supplied from the voltage supply 83. When the power amplifier stage 82 is composed of bipolar transistors, bases or collectors of the bipolar transistors are biased by these bias voltages $V_1, V_2, \ldots, V_M$.

The transmitting section composed of the driver amplifier stage 86 and the power amplifier stage 82 handles the largest signal power in the communication device, involving large power consumption and thus tending more to cause distortion in amplification. However, in this eighth embodiment, with the power amplification circuit of the invention used in the transmitting section, it becomes possible to amplify a transmitting signal to a specified antenna output with low distortion and low power consumption, thus allowing the communication device 81 to be lowered in power consumption. Also, since amplification signal power by amplification stages increases with increasing nearness to the antenna 91, using the power amplification circuit of the invention for an amplifier closer to the antenna 91 is more effective for the lowering of the power consumption of the communication device. Also, the communication device 81, when of the battery-driven type as in the eighth embodiment, can be prolonged in its communication time lasting to the battery exhaustion. Further, for the same communication time as the conventional, smaller-size batteries become usable, which makes it possible to reduce the size and weight of the communication device.

Furthermore, when the communication device of this eighth embodiment is used in communication systems in which transmitting power amplification circuits are required to meet strictly low distortion characteristics typified by adjacent-channel power leakage standards, such as W-CDMA (Wideband Code Division Multiple Access), IS-95 (United States' standards for digital cellular phones of CDMA system), PDC (Personal Digital Cellular: Japan's existing standards for digital cellular phones), PHS (Personal Handiphone System) and IMT-2000 (International Mobile Telecommunication 2000), it is possible to satisfy low distortion and high efficiency of the transmitting power amplification circuit at the same time, hence a more preferable embodiment of the invention.

Ninth Embodiment

Figure 15:
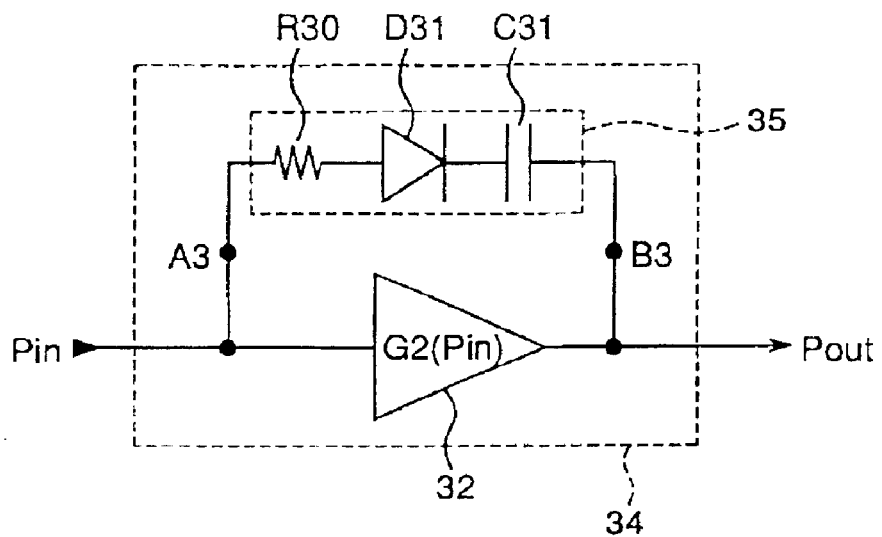
FIG. 15 is a circuit diagram of a power amplification circuit in a ninth embodiment of the invention.

FIG. 15 shows a circuit diagram of a power amplification circuit 34 in a ninth embodiment of the invention. This power amplification circuit 34 of the ninth embodiment is similar in constitution to the power amplification circuit 31 of the third embodiment shown in FIG. 3 except its feedback resistor R30. Therefore, like constituent parts are designated by like reference numerals and their detailed description is omitted.

As shown in FIG. 15, one end of a feedback resistor R30 is connected to an anode of a diode D31, while the other end of the feedback resistor R30 is connected to a signal input terminal of a power amplifier 32. Like this, this power amplification circuit 91 of the ninth embodiment employs a series connection circuit composed of the feedback resistor R30, the diode D31 and a capacitance device C31 connected in this order in series in place of the parallel negative feedback circuit 13 of the power amplification circuit 11 of the first embodiment shown in FIG. 1. A negative feedback circuit 35 composed of the feedback resistor R30, the diode D31 and the capacitance device C31 has an impedance Z3 between A3 and B3 at its both sides.

The power amplification circuit 91 of this constitution not only produces the same effects as the power amplification circuit 31 of the third embodiment, but also allows the absolute value of negative feedback quantity and the rate of change of impedance of the negative feedback circuit 35 to be set arbitrarily by adjusting the resistance value of the feedback resistor R30 used in the negative feedback circuit 35.

In the above ninth embodiment, a series connection circuit composed of the feedback resistor R30, the diode D31 and the capacitance device C31 connected in series in this order has been used for the negative feedback circuit 35. However, a series connection circuit made up by connecting a diode, a feedback resistor and a capacitance device in this order in series or a series connection circuit made up by connecting a diode, a capacitance device and a feedback resistor in this order in series may be used alternatively.

Tenth Embodiment

Figure 16:
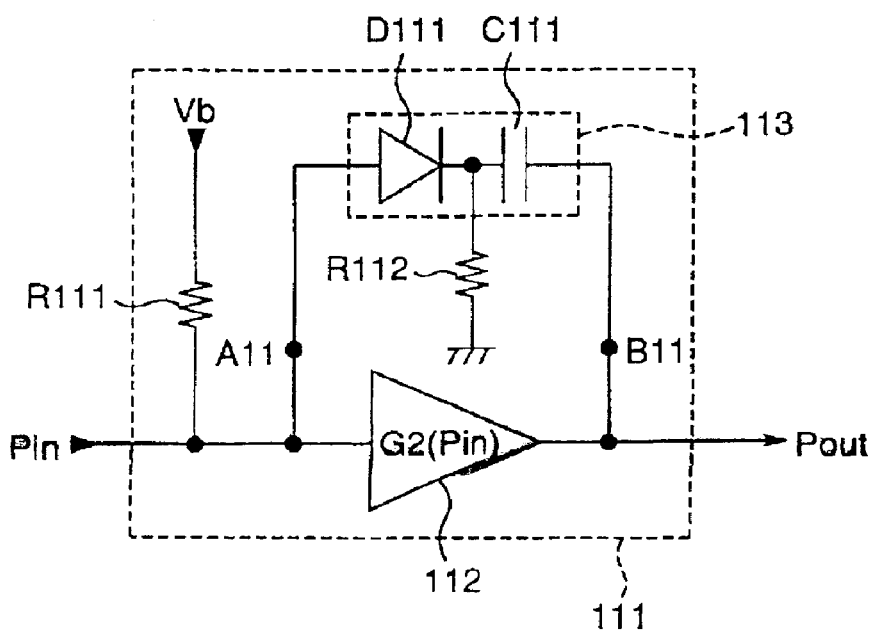
FIG. 16 is a circuit diagram of a power amplification circuit in a tenth embodiment of the invention.

FIG. 16 shows a circuit diagram of a power amplification circuit 111 in a tenth embodiment of the invention. This power amplification circuit 111 of the tenth embodiment employs a series connection circuit composed of a diode D31 and a capacitance device C31 in place of the parallel negative feedback circuit 13 of the power amplification circuit of the first embodiment shown in FIG. 1. In this power amplification circuit 111, as shown in FIG. 16, a connecting point between a cathode of the diode D111 and the capacitance device C111 is grounded via a bias grounding resistor R112. Also, a bias power supply Vb is connected to a signal input terminal of a power amplifier 112 located on the anode side of the diode D111 via a bias resistor R111.

This power-amplification circuit 111 of the tenth embodiment is so constituted that the bias power supply Vb and the bias resistor R111 for the power amplifier 112 as well as the bias grounding resistor R112 for the diode D111 are added to the power amplification circuit 31 of the third embodiment shown in FIG. 3. The bias power supply Vb is a base-bias power supply or a collector-bias power supply in the case where the power amplifier 112 is given by a bipolar transistor, and a gate-bias power supply or a drain-bias power supply in the case where the power amplifier 112 is given by a field effect transistor. The bias power supply Vb of this tenth embodiment is a base-bias power supply. The path running from the bias power supply Vb through the diode D111 and the grounding resistor R112 to the ground is conducting in direct current, so that the diode D111 is biased by the bias power supply Vb. The negative feedback circuit 113 composed of the diode D111 and the capacitance device C111 has an impedance Z11 between A11 and B11 at its both sides.

In this power amplification circuit 111 of the tenth embodiment, adjusting the bias of the diode D111 allows the variable impedance characteristic due to a signal voltage thereacross to be set with higher degree of freedom than in the power amplification circuit of the third embodiment, so that distortion of the power amplifier can further be reduced.

For example, when the diode D111 is biased to around its turn-on voltage, the diode D111 is changed in characteristics from OFF state to ON state by increases or decreases in the voltage across the diode D111, so that a wide variable impedance characteristic can be obtained. Meanwhile, when the diode D111 is biased to a voltage sufficiently higher than its turn-on voltage, the diode D111 is not changed in characteristics until its turning OFF even by increases or decreases in the signal voltage thereacross, so that a relatively narrow variable impedance characteristic to be obtained.

Also, in this power amplification circuit 111 of the tenth embodiment, since the diode D111 is biased by the bias power supply for the power amplifier 112, there is no need for any additional control-voltage generating means. However, since the bias of the power amplifier 112 is affected by the bias to the diode D111 unlike the power amplification circuit 31 of the third embodiment, it is necessary to adjust the resistance value of the bias resistor R111 or the voltage value of the bias power supply Vb by an extent corresponding to a voltage drop at the bias resistor R111 due to the current flowing through the diode D111.

Further, also in this power amplification circuit 111 of the tenth embodiment, there is no need for any additional input-signal-power detecting means or additional negative feedback quantity controlling means, which allows the low-distortion power amplification circuit to be downsized.

Eleventh Embodiment

Figure 17:
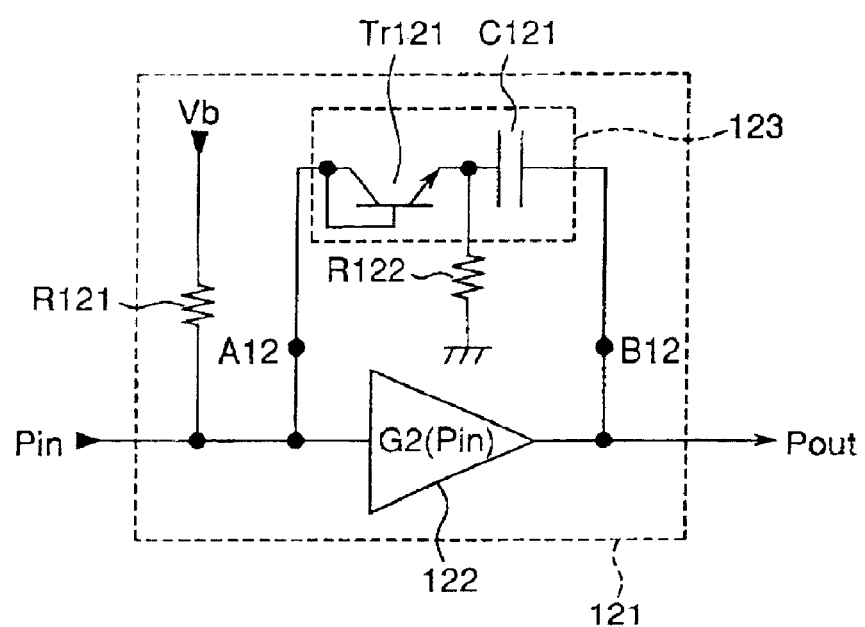
FIG. 17 is a circuit diagram of a power amplification circuit in an eleventh embodiment of the invention.

FIG. 17 shows a circuit diagram of a power amplification circuit 121 in an eleventh embodiment of the invention. This power amplification circuit 121 of the eleventh embodiment is so constituted that a base-emitter junction of a bipolar transistor Tr121 is used in place of the diode D111 in the power amplification circuit 111 of the tenth embodiment shown in FIG. 16. In this power amplification circuit 121, as shown in FIG. 17, a connecting point between the emitter of the bipolar transistor Tr121 and a capacitance device C121 is grounded via a bias grounding resistor R122. Also, a bias power supply Vb is connected to a signal input terminal of a power amplifier 112 located on the collector side of the bipolar transistor Tr121 via a bias resistor R121.

In the power amplification circuit 121, the collector of the bipolar transistor Tr121 is short-circuited to its base, but the collector may be in the open state. Also, the base-collector junction of the bipolar transistor Tr121 may be used as the diode. A negative feedback circuit 123 composed of the bipolar transistor Tr121 and the capacitance device C121 has an impedance Z12 between A12 and B12 at its both sides.

For the constitution of the power amplification circuit 121, a power amplifier 122 or the bipolar transistor Tr121 that operates as a diode may be given by discrete components in one case, and these may be implemented as an IC (Integrated Circuit) formed on one semiconductor substrate in another case.

In the case where the power amplification circuit 121 is formed as an IC and where the power amplifier 122 is formed by using a bipolar transistor as an amplification element, implementing the diode by the bipolar transistor Tr121 makes it possible to manufacture the bipolar transistor Tr121 by the same manufacturing process as the aforementioned bipolar transistor as an amplification element. Thus, the negative feedback circuit 123 can also be manufactured simultaneously in the manufacturing process of the power amplifier 122 without increasing manufacturing processes.

Also, a field effect transistor may be used in place of the bipolar transistor Tr121 of the power amplification circuit 121 of the eleventh embodiment. Further, it is more preferable that the power amplification circuit 121 is given as an IC and that the power amplifier 122 is given by using a field effect transistor as an amplification element, from the standpoint of simplification of manufacturing processes.

Twelfth Embodiment

Figure 18:
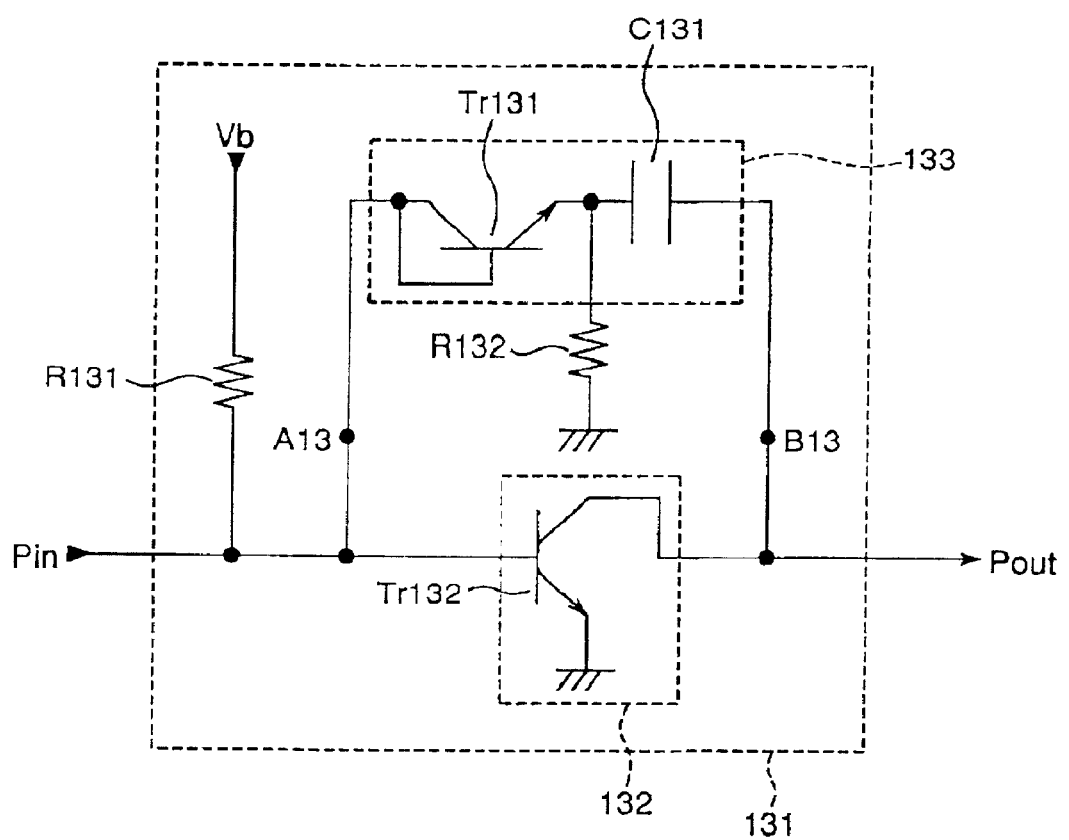
FIG. 18 is a circuit diagram of a power amplification circuit in a twelfth embodiment of the invention.

FIG. 18 is a circuit diagram of a power amplification circuit 121 in a twelfth embodiment of the invention, showing a concrete circuit of the power amplification circuit 121 of the eleventh embodiment. A power amplifier 132 equivalent to the power amplifier 122 of the power amplification circuit 121 of the eleventh embodiment is made up by using an emitter-grounded bipolar transistor Tr132. In this power amplification circuit 131, as shown in FIG. 18, a connecting point between an emitter of the bipolar transistor Tr131 and a capacitance device C131 is grounded via a bias grounding resistor R132. Also, a bias power supply Vb is connected to a signal input terminal of the power amplifier 132 located on the collector side of the bipolar transistor Tr131 via a bias resistor R131. A negative feedback circuit 133 composed of the bipolar transistor Tr131 and the capacitance device C131 has an impedance Z13 between A13 and B13 at its both sides.

In the power amplification circuit 131 of this constitution, since a positive voltage is applied to the base-bias power supply Vb to drive the bipolar transistor Tr132 of the power amplifier 132, connecting the emitter terminal (corresponding to the cathode terminal of the diode) of the bipolar transistor Tr131, which is used as a diode, to the grounding side (a terminal of the resistor R132) as in this embodiment allows the bias of the diode to be set over a wider range from OFF state to ON state, so that the variable impedance characteristic can be adjusted with higher degree of freedom.

Also, when the bipolar transistor Tr131 used as the diode and the bipolar transistor Tr132 of the power amplifier 132 are generally equal in bias-current temperature characteristics, bias-current temperature characteristics of the bipolar transistor Tr132 are compensated by bias-current temperature characteristics of the bipolar transistor Tr131, so that a temperature-compensated stable operation becomes implementable.

Also, a field effect transistor may be used in place of the bipolar transistor Tr131 of the power amplification circuit 131 of the twelfth embodiment. Further, it is more preferable that the power amplification circuit 131 is given as an IC and that the power amplifier 132 is given by using a field effect transistor as an amplification device, from the standpoint of simplification of manufacturing processes.

Thirteenth Embodiment

Figure 19:
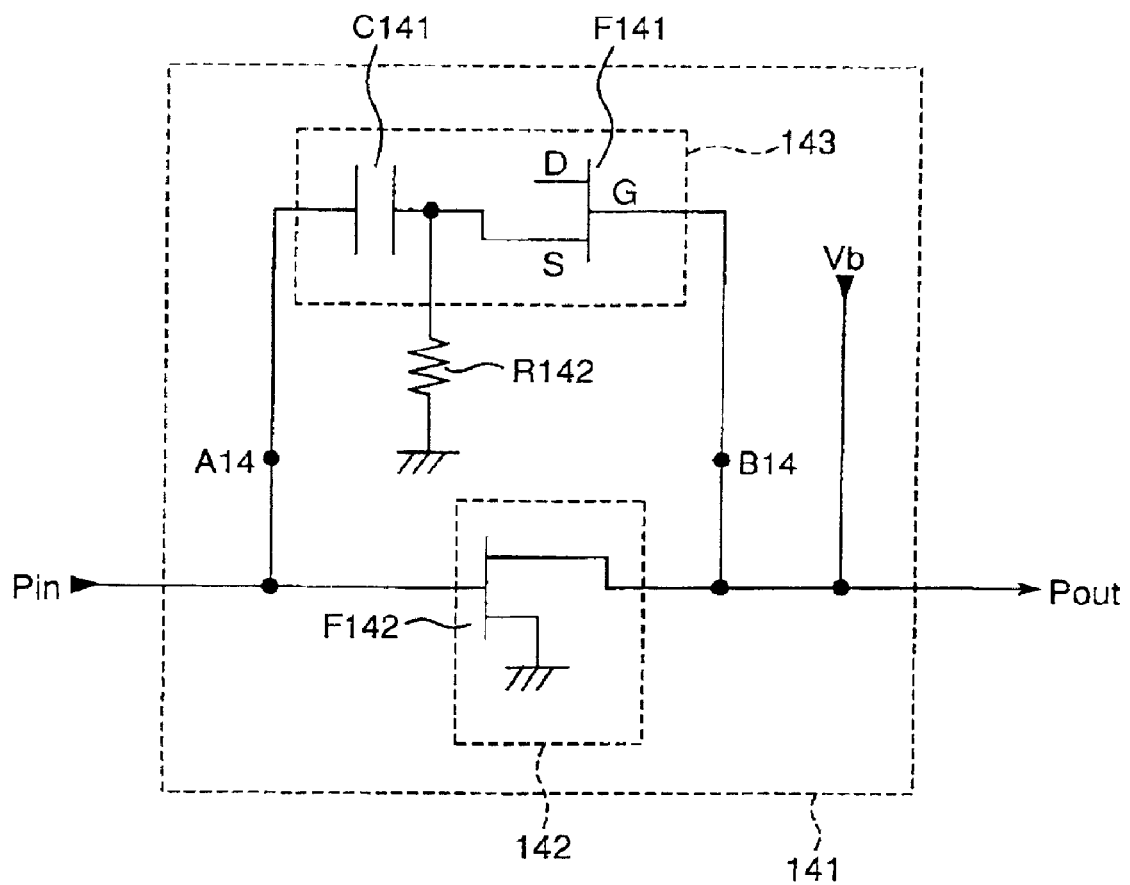
FIG. 19 is a circuit diagram of a power amplification circuit in a thirteenth embodiment of the invention.

FIG. 19 shows a circuit diagram of a power amplification circuit 141 in a thirteenth embodiment of the invention. This power amplification circuit 141 of the thirteenth embodiment shows an embodiment in which field effect transistors are used as a power amplification device and a diode, where the power amplifier 112 of the tenth embodiment shown in FIG. 16 is replaced with a source-grounded field effect transistor. F142, and a negative feedback circuit 113 shown in FIG. 16 is replaced with a series connection circuit composed of a gate (G) source (S) junction of the field effect transistor F141 and the capacitance device C141. A negative feedback circuit 143 composed of the field effect transistor F141 and the capacitance device C141 has an impedance Z14 between A14 and B14 at its both sides.

The gate of the field effect transistor F141 used as a diode is connected to a drain-bias power supply Vb of the field effect transistor F142, and the source of the field effect transistor F141 is grounded via a grounding resistor R142. The drain of the field effect transistor F141 is in the open state, but may also be connected to the source of the field effect transistor F141.

Since a positive voltage is applied from the drain-bias power supply Vb, connecting the source terminal (corresponding to the cathode terminal of the diode) of the field effect transistor F141, which is used as a diode, to the grounding side (a terminal of the resistor R142) as in this embodiment allows the bias of the diode to be set over a wider range from OFF state to ON state, so that the variable impedance characteristic can be adjusted with higher degree of freedom.

Fourteenth Embodiment

Figure 20:
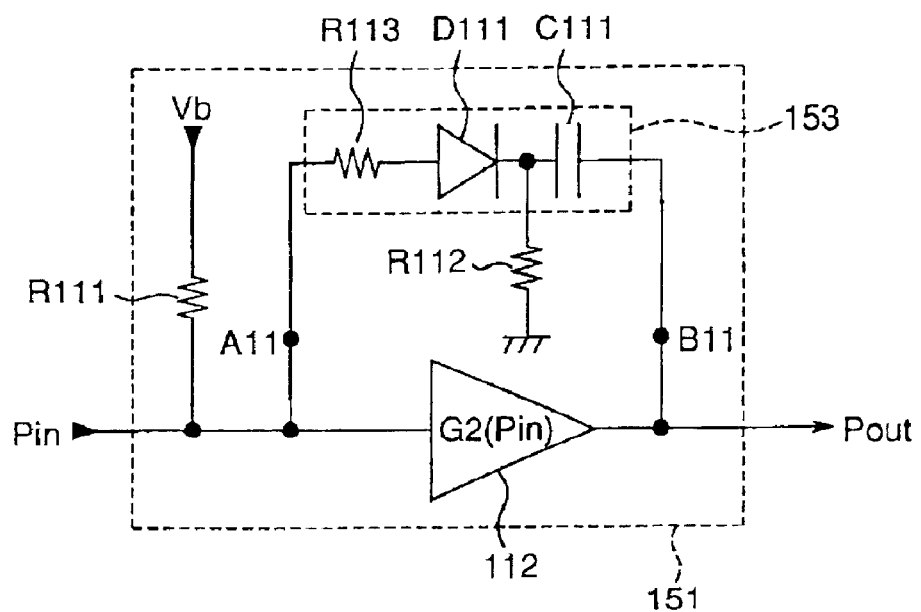
FIG. 20 is a circuit diagram of a power amplification circuit in a fourteenth embodiment of the invention.

FIG. 20 shows a circuit diagram of a power amplification circuit 151 in a fourteenth embodiment of the invention. This power amplification circuit 151 of the fourteenth embodiment is similar in constitution to the power amplification circuit 111 of the tenth embodiment shown in FIG. 16 except the feedback resistor R113. Therefore, like constituent parts are designated by like reference numerals and their description is omitted.

As shown in FIG. 16, one end of the feedback resistor R113 is connected to an anode of the diode D111, while the other end of its feedback resistor R113 is connected to a signal input terminal of a power amplifier 112. Like this, this power amplification circuit 151 of the fourteenth embodiment employs a series connection circuit composed of the feedback resistor R113, the diode D111 and a capacitance device C111 connected in this order in series. A negative feedback circuit 153 composed of the feedback resistor R113, the diode D111 and the capacitance device C111 has an impedance Z15 between A15 and B15 at its both sides.

The power amplification circuit 151 of this constitution not only produces the same effects as that of the power amplification circuit 31 of the third embodiment shown in FIG. 3, but also allows the absolute value of negative feedback quantity and the rate of change of impedance of the negative feedback circuit 153 to be set arbitrarily by adjusting the resistance value of the feedback resistor R113 used in the negative feedback circuit.

In the above fourteenth embodiment, a series connection circuit composed of the feedback resistor R113, the diode D111 and the capacitance device C111 connected in series in this order has been used for the negative feedback circuit. However, a series connection circuit made up by connecting a diode, a capacitance device and a feedback resistor in this order in series may be used of the negative feedback circuit. Also, a series connection circuit in which feedback resistors are connected to both ends, respectively, of a circuit formed by connecting a diode and a capacitance device in series may be used for the negative feedback circuit. Further, a series connection circuit formed by connecting a diode, a feedback resistor and a capacitance device in series in this order may be used for the negative feedback circuit, in which case any one end of the feedback resistor is grounded via a grounding resistor.

As apparent from the above description, according to the power amplification circuit of the present invention, there can be realized a power amplification circuit which meets low distortion and high efficiency required for radio communications systems such as cellular phones and radio LAN.

Further, according to the communication device of the present invention, with the above power amplification circuit used for the transmitting section, the communication device can be reduced in size and a transmitting signal can be amplified with low distortion and low power consumption, allowing the communication device to be lowered in power consumption.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A power amplification circuit comprising:

a power amplifier; and a negative feedback circuit connected between a power signal input terminal and a power signal output terminal of the power amplifier, wherein impedance of the negative feedback circuit depends on a signal voltage occurring across the negative feedback circuit, and wherein the negative feedback circuit is a series connection circuit consisting essentially of a diode and a capacitance device connected in series, wherein the diode has a variable impedance characteristic.

2. The power amplification circuit according to claim 1, wherein the impedance of the negative feedback circuit increases with an increasing input signal power to the power amplifier.

3. A power amplification circuit comprising:

a power amplifier; and a negative feedback circuit connected between a power signal input terminal and a power signal output terminal of the power amplifier, wherein impedance of the negative feedback circuit depends on a signal voltage occurring across the negative feedback circuit, and wherein the negative feedback circuit is a series connection circuit consisting essentially of a diode, a capacitance device and a feedback resistor connected in series, wherein the diode has a variable impedance characteristic.

4. The power amplification circuit according to claim 3, wherein the impedance of the negative feedback circuit increases with an increasing input signal power to the power amplifier.

5. A power amplification circuit comprising:

a power amplifier; and a negative feedback circuit connected between a power signal input terminal and a power signal output terminal of the power amplifier, wherein impedance of the negative feedback circuit depends on a signal voltage occurring across the negative feedback circuit, and wherein the negative feedback circuit is a series connection circuit in which a first diode and a second diode are connected to each other in series so that their forward directions are opposed to each other, wherein at least one of the first and second diodes have a variable impedance characteristic.

6. The power amplification circuit according to claim 5, wherein the first and second diodes of the series connection circuit are each constituted of a base-emitter junction or a base-collector junction of one bipolar transistor.

7. The power amplification circuit according to claim 5, wherein the first and second diodes of the series connection circuit are constituted of a junction between two terminals out of base, collector and emitter of a first bipolar transistor, and a junction between two terminals out of base, collector and emitter of a second bipolar transistor, respectively.

8. The power amplification circuit according to claim 5, wherein the first and second diodes of the series connection circuit are constituted of a junction between two terminals out of gate, drain and source of a first field effect transistor, and a junction between two terminals out of gate, drain and source of a second field effect transistor, respectively.

9. The power amplification circuit according to claim 5, wherein the second diode has a junction area larger than the first diode.

10. The power amplification circuit according to claim 5, wherein the impedance of the negative feedback circuit increases with an increasing input signal power to the power amplifier.

* * * * *